United States Patent
Stegen et al.

(10) Patent No.: US 11,156,921 B2
(45) Date of Patent: Oct. 26, 2021

(54) FLUID HANDLING STRUCTURE, LITHOGRAPHIC APPARATUS, AND METHOD OF USING A FLUID HANDLING STRUCTURE

(71) Applicant: ASML NETHERLANDS B.V., Veldhoven (NL)

(72) Inventors: Raphael Nico Johan Stegen, Eindhoven (NL); Giovanni Luca Gattobigio, Eindhoven (NL); Theodorus Wilhelmus Polet, Geldrop (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 16/767,987

(22) PCT Filed: Nov. 22, 2018

(86) PCT No.: PCT/EP2018/082188
§ 371 (c)(1),
(2) Date: May 28, 2020

(87) PCT Pub. No.: WO2019/115197
PCT Pub. Date: Jun. 20, 2019

(65) Prior Publication Data
US 2021/0191275 A1 Jun. 24, 2021

(30) Foreign Application Priority Data
Dec. 15, 2017 (EP) .................................... 17207820

(51) Int. Cl.
*G03F 7/20* (2006.01)
(52) U.S. Cl.
CPC ...... *G03F 7/70341* (2013.01); *G03F 7/70808* (2013.01)

(58) Field of Classification Search
CPC ............. G03F 7/70341; G03F 7/70866; G03F 7/70808
(Continued)

(56) References Cited

U.S. PATENT DOCUMENTS 6,952,253 B2    10/2005  Lof et al.
8,896,806 B2 *  11/2014  Sato ..................... G03F 7/70341
                                                        355/30

(Continued)

FOREIGN PATENT DOCUMENTS

JP   2009-088037 A    4/2009
JP   2011-086804 A    4/2011
(Continued)

OTHER PUBLICATIONS

International Search Report dated Feb. 22, 2019 issued in corresponding International Patent Application No. PCT/EP2018/082188.
(Continued)

*Primary Examiner* — Hung Nguyen
(74) *Attorney, Agent, or Firm* — Pillsbury Winthrop Shaw Pittman, LLP

(57) ABSTRACT

A fluid handling structure configured to confine immersion fluid to a region of a lithographic apparatus, the fluid handling structure having an aperture formed therein for the passage therethrough of a radiation beam through the immersion fluid, the aperture defining an immersion space to be filled with the immersion fluid, and having an inner part and an outer part, wherein the inner part and the outer part are arranged so as to form therebetween a variable space and a connecting space that connects the variable space to the immersion space, wherein the outer part is movable relative to the inner part in a first plane so as to change in shape the variable space but not the connecting space, and wherein the
(Continued)

fluid handling structure is configured to contain the immersion fluid in the variable space.

20 Claims, 5 Drawing Sheets

(58) Field of Classification Search
USPC .................................................... 355/30, 53
See application file for complete search history.

(56) References Cited

U.S. PATENT DOCUMENTS

| | | | |
|---|---|---|---|
| 9,651,873 B2* | 5/2017 | Sato | .............. G03F 7/70866 |
| 2005/0263068 A1 | 12/2005 | Hoogendam et al. | |
| 2007/0109513 A1 | 5/2007 | Leenders et al. | |
| 2007/0110213 A1 | 5/2007 | Leenders et al. | |
| 2008/0174748 A1 | 7/2008 | Nagasaka | |
| 2008/0233512 A1* | 9/2008 | Nishii | ............. G03F 7/70341 |
| | | | 430/117.32 |
| 2009/0231560 A1 | 9/2009 | Poon et al. | |
| 2011/0007286 A1 | 1/2011 | Direcks et al. | |
| 2013/0188159 A1 | 7/2013 | Shibazaki | |
| 2013/0265555 A1 | 10/2013 | Shibazaki | |
| 2013/0265556 A1 | 10/2013 | Sato | |
| 2014/0022522 A1 | 1/2014 | Sato | |
| 2014/0253886 A1 | 9/2014 | Sato | |
| 2014/0285781 A1 | 9/2014 | Sato | |
| 2014/0300875 A1 | 10/2014 | Sato et al. | |
| 2014/0307235 A1 | 10/2014 | Sato | |
| 2015/0036112 A1 | 2/2015 | Sato | |

FOREIGN PATENT DOCUMENTS

| | | |
|---|---|---|
| JP | 2013-236000 A | 11/2013 |
| JP | 2013-251311 A | 12/2013 |
| JP | 2014-086456 A | 5/2014 |
| JP | 2014-086678 A | 5/2014 |
| JP | 2014-093479 A | 5/2014 |
| JP | 2014-096481 A | 5/2014 |
| JP | 2014-120691 A | 6/2014 |
| JP | 2014-120693 A | 6/2014 |
| JP | 2014-146798 A | 8/2014 |
| JP | 2014-154700 A | 8/2014 |
| JP | 2014-175455 A | 9/2014 |
| JP | 2014-179509 A | 9/2014 |
| JP | 2015-076521 A | 4/2015 |
| JP | 2015-173202 A | 10/2015 |
| TW | 201122731 | 7/2011 |
| WO | 99/49504 A1 | 9/1999 |
| WO | 2013/100114 A1 | 7/2013 |
| WO | 2014/104107 A1 | 7/2014 |
| WO | 2015/052781 A1 | 4/2015 |
| WO | 2017/054987 A1 | 4/2017 |

OTHER PUBLICATIONS

Taiwanese Office Action issued In corresponding Taiwanese Patent Application No. 109105674, dated Jun. 24, 2021.

* cited by examiner

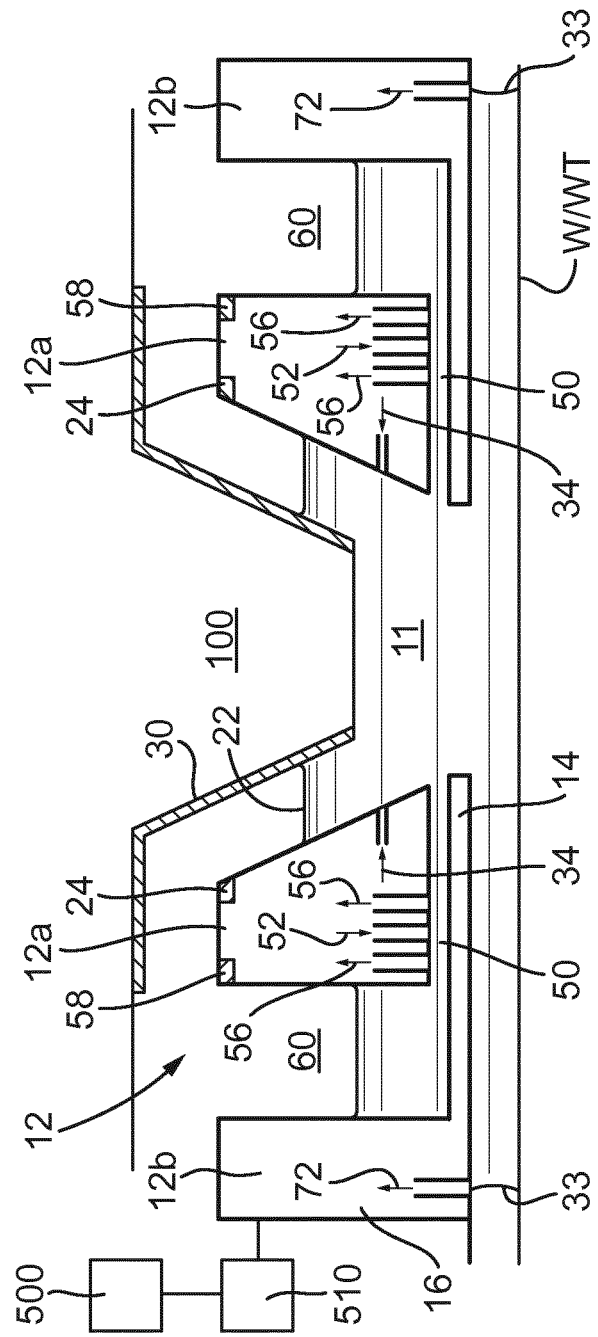

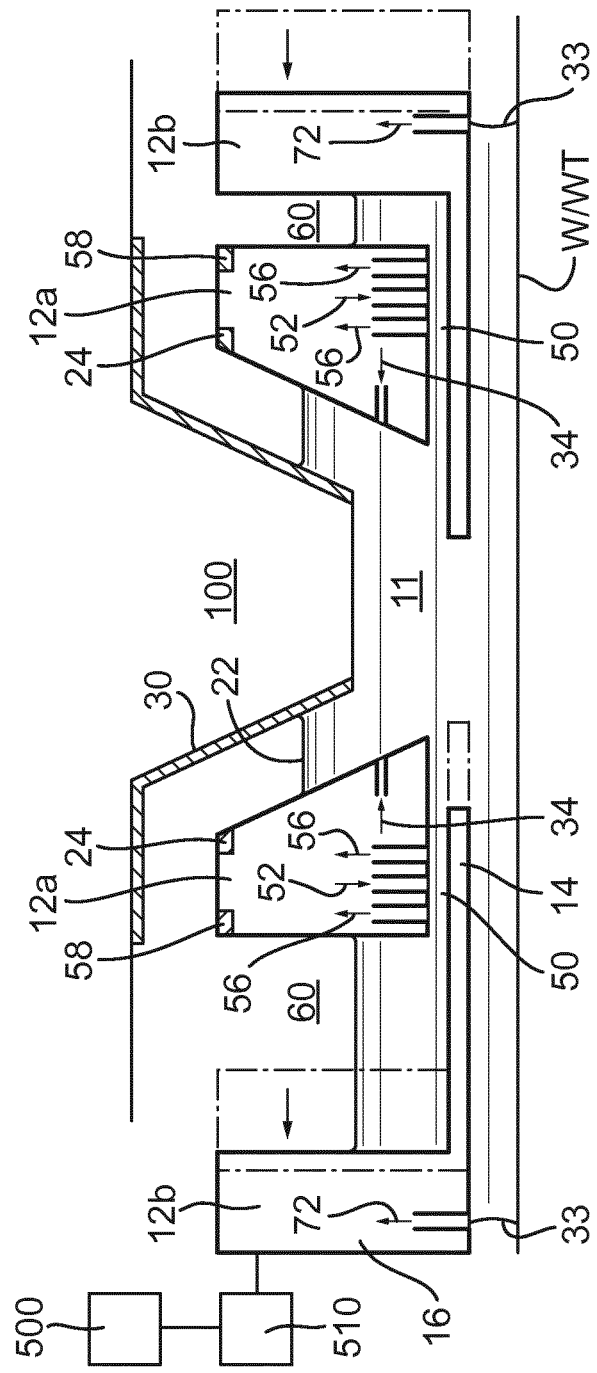

FLUID HANDLING STRUCTURE, LITHOGRAPHIC APPARATUS, AND METHOD OF USING A FLUID HANDLING STRUCTURE

CROSS-REFERENCE TO RELATED APPLICATIONS

This application is the U.S. national phase entry of PCT Patent Application No. PCT/EP2018/082188), which was filed on Nov. 22, 2018, which claims the benefit of priority of European Patent Application No. 17207820.6 which was filed on 15 Dec. 2017 and which is incorporated herein in its entirety by reference.

FIELD

The present invention relates to a fluid handling structure configured to confine immersion fluid to a region of a lithographic apparatus, a lithographic apparatus comprising the fluid handling structure, and methods of using the fluid handling structure and the lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer). Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Further improvements in the resolution of smaller features may be achieved by providing an immersion fluid having a relatively high refractive index, such as water, on the substrate during exposure. The effect of the immersion fluid is to enable imaging of smaller features since the exposure radiation will have a shorter wavelength in the fluid than in gas. The effect of the immersion fluid may also be regarded as increasing the effective numerical aperture (NA) of the system and also increasing the depth of focus.

The immersion fluid may be confined to a localized area between the projection system of the lithographic apparatus and the substrate by a fluid handling structure. Fast relative movement between the substrate and the confined immersion liquid may cause leaking of the immersion fluid from the localized area. Such leaking is undesirable and may lead to defects on the substrate. The speed at which the substrate is stepped or scanned with respect to the projection system is thus limited. This limits the throughput of the lithographic apparatus.

SUMMARY

It is an object of the present invention to provide a fluid handling structure and a lithographic apparatus in which measures are taken to increase throughput.

In an embodiment of the present invention there is provided a fluid handling structure configured to confine immersion fluid to a region of a lithographic apparatus, the fluid handling structure comprising an aperture formed therein for the passage therethrough of a radiation beam through the immersion fluid, the aperture defining an immersion space to be filled with the immersion fluid, and an inner part and an outer part; wherein the inner part and the outer part are arranged so as to form therebetween a variable space and a connecting space that connects the variable space to the immersion space, wherein the outer part is movable relative to the inner part in a first plane so as to change in shape the variable space but not the connecting space, and wherein the fluid handling structure is configured to contain the immersion fluid in the variable space.

In another embodiment of the present invention there is provided a lithographic apparatus comprising the fluid handling structure, a projection system comprising a final element, the inner part of the fluid handling structure being fixed with respect to the final element, and a substrate support configured to support a substrate, the substrate support being movable with respect to the final element in the first plane.

In another embodiment of the present invention there is provided a method of using the fluid handling structure, the method comprising providing the immersion fluid in the immersion space, the connecting space and the variable space using a fluid supply system.

In another embodiment of the present invention there is provided a method of using the lithographic apparatus, the method comprising providing the immersion fluid in the immersion space, the connecting space and the variable space using a fluid supply system.

BRIEF DESCRIPTION OF THE DRAWINGS

Embodiments of the invention will now be described, by way of example only, with reference to the accompanying schematic drawings, in which:

FIGS. 3a and 3b illustrate, in cross-section, a fluid handling structure of an embodiment of the present invention, with the movable outer part in two different positions.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
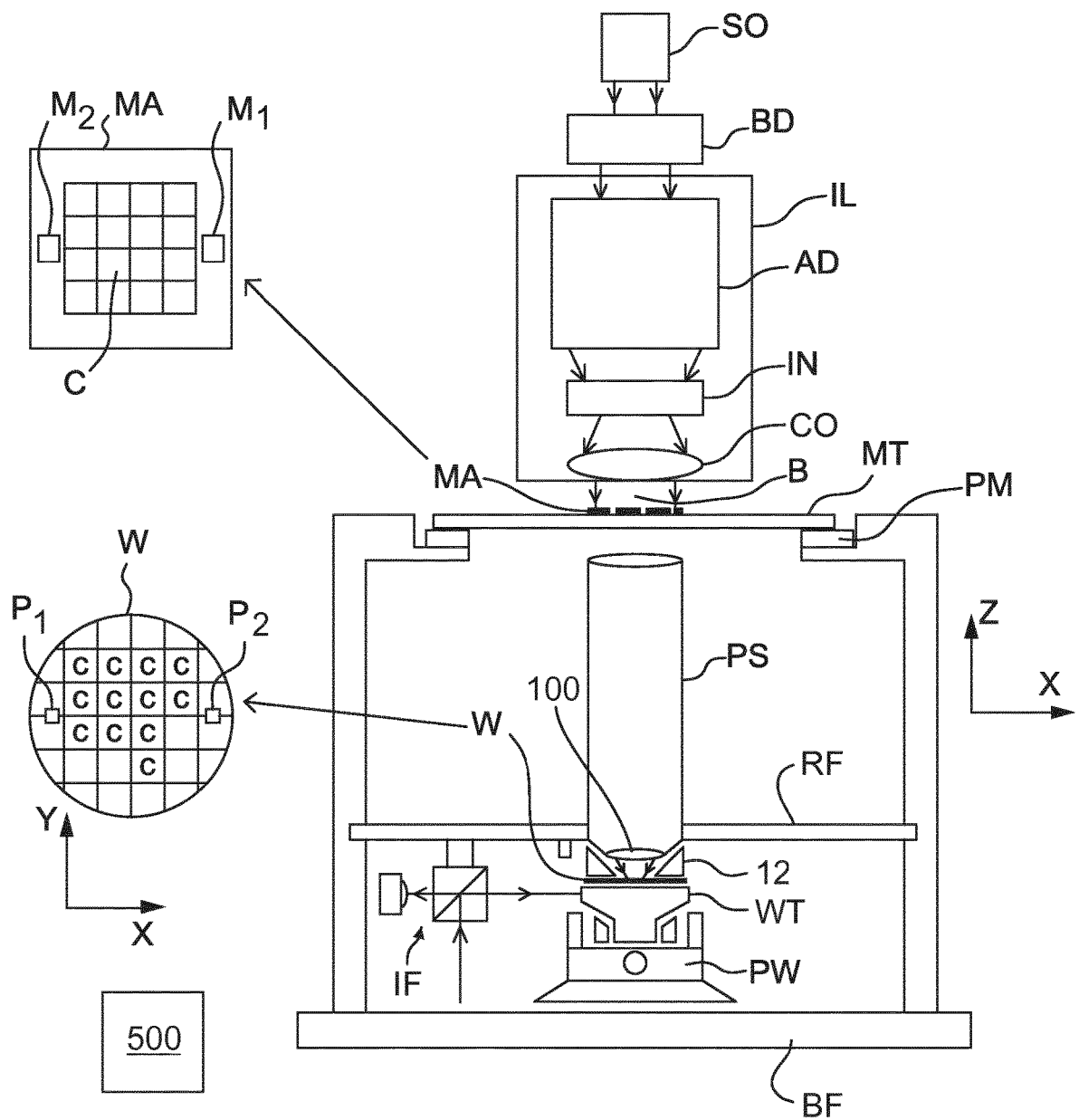
FIG. 1 depicts a schematic overview of a lithographic apparatus.

FIG. 1 schematically depicts a lithographic apparatus. The lithographic apparatus includes an illumination system (also referred to as illuminator) IL configured to condition a radiation beam B (e.g., UV radiation or DUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a substrate table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus is of a type wherein at least a portion of the substrate W may be covered by an immersion liquid having a relatively high refractive index, e.g., water, so as to fill an immersion space 11 between the projection system PS and the substrate W—which is also referred to as immersion lithography. More information on immersion techniques is given in U.S. Pat. No. 6,952,253, which is incorporated herein by reference.

The lithographic apparatus may be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Immersion techniques have been introduced into lithographic systems to enable improved resolution of smaller features. In an immersion lithographic apparatus, a liquid layer of immersion liquid having a relatively high refractive index is interposed in the immersion space 11 between a projection system PS of the apparatus (through which the patterned beam is projected towards the substrate W) and the substrate W. The immersion liquid covers at least the part of the substrate W under a final element of the projection system PS. Thus, at least the portion of the substrate W undergoing exposure is immersed in the immersion liquid.

In commercial immersion lithography, the immersion liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the immersion space 11 as immersion liquid. Other liquids with a high refractive index can be used besides water can be used as the immersion liquid, for example: a hydrocarbon, such as a fluorohydrocarbon; and/or an aqueous solution. Further, other fluids besides liquid have been envisaged for use in immersion lithography.

In this specification, reference will be made in the description to localized immersion in which the immersion liquid is confined, in use, to the immersion space 11 between the final element 100 and a surface facing the final element 100. The facing surface is a surface of substrate W or a surface of the supporting stage (or substrate support WT) that is co-planar with the surface of the substrate W. (Please note that reference in the following text to surface of the substrate W also refers in addition or in the alternative to the surface of the substrate support WT, unless expressly stated otherwise; and vice versa). A fluid handling structure 12 present between the projection system PS and the substrate support WT is used to confine the immersion liquid to the immersion space 11. The immersion space 11 filled by the immersion liquid is smaller in plan than the top surface of the substrate W and the immersion space 11 remains substantially stationary relative to the projection system PS while the substrate W and substrate support WT move underneath.

Other immersion systems have been envisaged such as an unconfined immersion system (a so-called 'All Wet' immersion system) and a bath immersion system. In an unconfined immersion system, the immersion liquid covers more than the surface under the final element 100. The liquid outside the immersion space 11 is present as a thin liquid film. The liquid may cover the whole surface of the substrate W or even the substrate W and the substrate support WT co-planar with the substrate W. In a bath type system, the substrate W is fully immersed in a bath of immersion liquid.

The fluid handling structure 12 is a structure which supplies the immersion liquid to the immersion space 11, removes the immersion liquid from the immersion space 11 and thereby confines the immersion liquid to the immersion space 11. It includes features which are a part of a fluid supply system. The arrangement disclosed in PCT patent application publication no. WO 99/49504 is an early fluid handling structure comprising pipes which either supply or recover the immersion liquid from the immersion space 11 and which operate depending on the relative motion of the stage beneath the projection system PS. In more recent designs, the fluid handling structure extends along at least a part of a boundary of the immersion space 11 between the final element 100 of the projection system PS and the substrate support WT or substrate W, so as to in part define the immersion space 11.

The fluid handing structure 12 may have a selection of different functions. Each function may be derived from a corresponding feature that enables the fluid handling structure 12 to achieve that function. The fluid handling structure 12 may be referred to by a number of different terms, each referring to a function, such as barrier member, seal member, fluid supply system fluid removal system, liquid confinement structure, etc.

As a barrier member, the fluid handling structure 12 is a barrier to the flow of the immersion liquid from the immersion space 11. As a liquid confinement structure, the structure confines the immersion liquid to the immersion space 11. As a seal member, sealing features of the fluid handling structure form a seal to confine the immersion liquid to the immersion space 11. The sealing features may include an additional gas flow from an opening in the surface of the seal member, such as a gas knife.

In an embodiment the fluid handling structure 12 may supply immersion fluid and therefore be a fluid supply system.

In an embodiment the fluid handling structure 12 may at least partly confine immersion fluid and thereby be a fluid confinement system.

In an embodiment the fluid handling structure 12 may provide a barrier to immersion fluid and thereby be a barrier member, such as a fluid confinement structure.

In an embodiment the fluid handling structure 12 may create or use a flow of gas, for example to help in controlling the flow and/or the position of the immersion fluid.

The flow of gas may form a seal to confine the immersion fluid so the fluid handling structure 12 may be referred to as a seal member; such a seal member may be a fluid confinement structure.

In an embodiment, immersion liquid is used as the immersion fluid. In that case the fluid handling structure 12 may be a liquid handling system. In reference to the aforementioned description, reference in this paragraph to a feature defined with respect to fluid may be understood to include a feature defined with respect to liquid.

A lithographic apparatus has a projection system PS. During exposure of a substrate W, the projection system PS projects a beam of patterned radiation onto the substrate W. To reach the substrate W, the path of the radiation beam B passes from the projection system PS through the immersion liquid confined by the fluid handling structure 12 between the projection system PS and the substrate W. The projection system PS has a lens element, the last in the path of the beam, which is in contact with the immersion liquid. This lens element which is in contact with the immersion liquid may be referred to as 'the last lens element' or "the final element". The final element 100 is at least partly surrounded by the fluid handling structure 12. The fluid handling structure 12 may confine the immersion liquid under the final element 100 and above the facing surface.

Figure 2A:
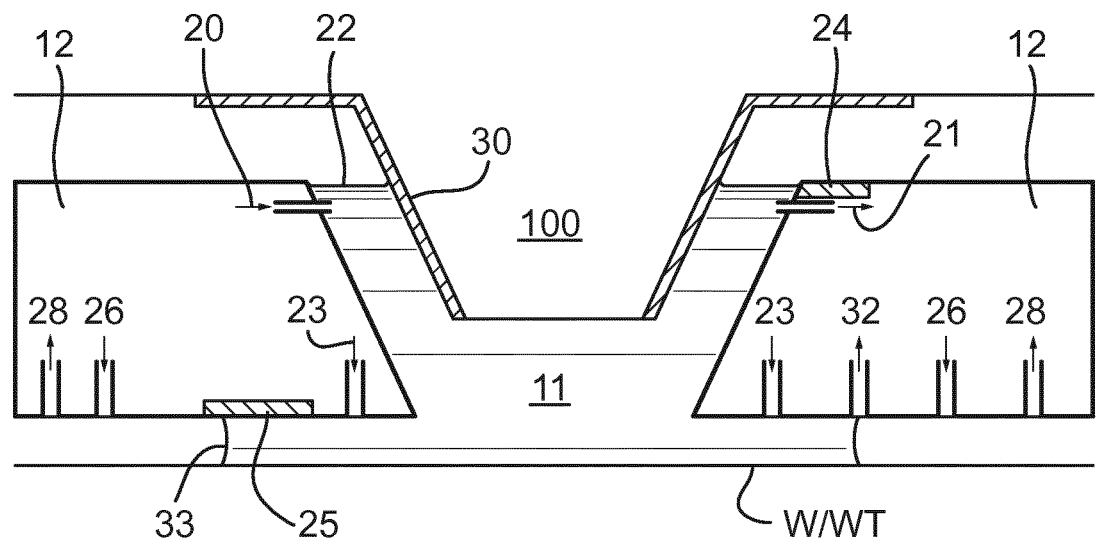
FIGS. 2a and 2b depict, in cross-section, two different versions of a fluid handling structure with different features illustrated on the left hand side and the right hand side, which may extend around the complete circumference.
Figure 2B:
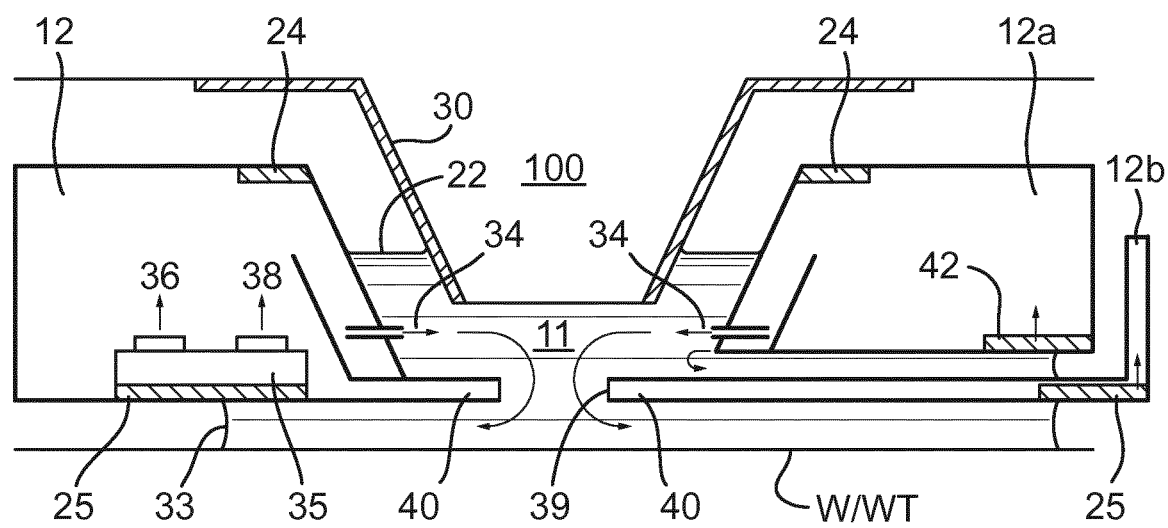

FIGS. 2a and 2b show different features which may be present in variations of fluid handling structure 12. The designs may share some of the same features as FIGS. 2a and 2b unless described differently. The features described herein may be selected individually or in combination as shown or as required.

FIG. 2a shows a fluid handling structure 12 around the bottom surface of a final element 100. The final element 100 has an inverted frusto-conical shape. The frusto-conical shape having a planaro bottom surface and a conical surface. The frusto-conical shape protrudes from a planar surface and having a bottom planar surface. The bottom planar surface is the optically active portion of the bottom surface of the final element 100, through which the radiation beam B may pass. The final element 100 may have a coating 30. The fluid handling structure 12 surrounds at least part of the frusto-conical shape. The fluid handling structure 12 has an inner-surface which faces towards the conical surface of the frusto-conical shape. The inner-surface and the conical surface have complementary shape. A top surface of the fluid handling structure 12 is substantially planar. The fluid handling structure 12 may fit around the frusto-conical shape of the final element 100. A bottom surface of the fluid handling structure 12 is substantially planar and in use the bottom surface may be parallel with the facing surface of the substrate support WT and/or substrate W. The distance between the bottom surface and the facing surface may be in the range of 30 to 500 micrometers, desirably in the range of 80 to 200 micrometers.

The fluid handling structure 12 extends closer to the facing surface of the substrate W and substrate support WT than the final element 100. The immersion space 11 is therefore defined between the inner surface of the fluid handling structure 12, the planar surface of the frusto-conical portion and the facing surface. During use, the immersion space 11 is filled with immersion liquid. The immersion liquid fills at least part of a buffer space between the complementary surfaces between the final element 100 and the fluid handling structure 12, in an embodiment at least part of the space between the complementary inner-surface and the conical surface.

The immersion liquid is supplied to the immersion space 11 through an opening formed in a surface of the fluid handling structure 12. The immersion liquid may be supplied through a supply opening 20 in the inner-surface of the fluid handling structure 12. Alternatively or additionally, the immersion liquid is supplied from an under supply opening 23 formed in the undersurface of the fluid handling structure 12. The under supply opening 23 may surround the path of the radiation beam B and it may be formed of a series of openings in an array. The immersion liquid is supplied to fill the immersion space 11 so that flow through the immersion space 11 under the projection system PS is laminar. The supply of the immersion liquid from the under supply opening 23 additionally prevents the ingress of bubbles into the immersion space 11. This supply of the immersion liquid functions as a liquid seal.

The immersion liquid may be recovered from a recovery opening 21 formed in the inner-surface. The recovery of the immersion liquid through the recovery opening 21 may be by application of an under pressure; the recovery through the recovery opening 21 as a consequence of the velocity of the immersion liquid flow through the immersion space 11; or the recovery may be as a consequence of both. The recovery opening 21 may be located on the opposite side of the supply opening 20, when viewed in plan. Additionally or alternatively, the immersion liquid may be recovered through an overflow recovery 24 located on the top surface of the fluid handling structure 12. In an embodiment, the supply opening 20 and recovery opening 21 can have their function swapped (i.e. the flow direction of liquid is reversed). This allows the direction of flow to be changed depending upon the relative motion of the fluid handling structure 12 and substrate W.

Additionally or alternatively, immersion liquid may be recovered from under the fluid handling structure 12 through a recovery opening 25 formed in its bottom surface. The recovery opening 25 may serve to hold (or 'pin') a meniscus 33 of the immersion liquid to the fluid handling structure 12. The meniscus 33 forms between the fluid handling structure 12 and the facing surface and it serves as border between the liquid space and the gaseous external environment. The recovery opening 25 may be a porous plate which may recover the immersion liquid in a single phase flow. The recovery opening in the bottom surface may be a series of pining openings 32 through which the immersion liquid is recovered. The pining openings 32 may recover the immersion liquid in a two phase flow.

Optionally radially outward, with respect to the inner-surface of the fluid handling structure 12, is an gas knife opening 26. Gas may be supplied through the gas knife opening 26 at elevated speed to assist liquid confinement of the immersion liquid in the immersion space 11. The supplied gas may be humidified and it may contain substantially carbon dioxide. Radially outward of the gas knife opening 26 is a gas recovery opening 28 for recovering the gas supplied through the gas knife opening 26. Further openings, for example open to atmosphere or to a gas source, may be present in the bottom surface of the fluid handling structure 12. For example, further openings may be present between gas knife opening 26 and gas recovery opening 28 and/or between pining openings 32 and gas knife opening 26.

The two different versions of the fluid handling structure 12 of the left and right sides of FIG. 2a pin the meniscus 33 at a position that is substantially fixed with respect to the final element 100. For the radiation beam B to be directed to a full side of the substrate W under exposure, the substrate support WT supporting the substrate W is moved relative to the projection system PS. To maximize the output of substrates W exposed by the lithographic apparatus, the substrate support WT (and so substrate W) is moved as fast as possible. However, there is a critical relative speed (often referred to as a critical scan speed) above which the meniscus 33 between the fluid handling structure 12 and the substrate W becomes unstable. An unstable meniscus has a greater risk of losing immersion liquid, for example in the form of one or more droplets. Furthermore, an unstable meniscus has a greater risk of resulting in the inclusion of gas bubbles in the immersion liquid, especially when the confined immersion liquid crosses the edge of the substrate W.

A droplet present on the surface of the substrate W may apply a thermal load and may be a source of defectivity. The droplet may evaporate leaving a drying stain, it may move transporting contamination such as a particle, it may collide with a larger body of immersion liquid introducing a bubble of gas into the larger body and it may evaporate, applying the thermal heat load to the surface on which it is located. Such a thermal load could be a cause of distortion and/or a source of a positioning error if the surface is associated with positioning of components of the lithographic apparatus relative to the substrate W being imaged. A formation of a droplet on a surface is therefore is undesirable. To avoid formation of such a droplet, the speed of the substrate support WT is thus limited to the critical scan speed at which the meniscus 33 remains stable. This limits the throughput of the lithographic apparatus.

FIG. 2b shows two different versions of the fluid handling structure 12 on its left side and on its right side, which allow movement of the meniscus 33 with respect to the final element 100. The meniscus 33 may move in the direction of the moving substrate W. This decreases the relative speed between the meniscus 33 and the moving substrate W, which may result in improved stability and a reduced risk of breakdown of the meniscus 33. The speed of the substrate W at which the meniscus 33 breaks down is increased so as to allow faster movement of the substrate W under the projection system PS. Throughput is thus increased.

Features shown in FIG. 2b which are common to FIG. 2a share the same reference numbers. The fluid handling structure 12 has an inner surface which complements the conical surface of the frusto-conical shape. The undersurface of the fluid handling structure 12 is closer to the facing surface than the bottom planar surface of the frusto-conical shape.

Immersion liquid is supplied to the immersion space 11 through supply openings 34 formed in the inner surface of the fluid handling structure 12. The supply openings 34 are located towards the bottom of the inner surface, perhaps below the bottom surface of the frusto-conical shape. The supply openings 34 are located around the inner surface, spaced apart around the path of the radiation beam B.

Immersion liquid is recovered from the immersion space 11 through recovery openings 25 in the undersurface of the fluid handling structure 12. As the facing surface moves under the fluid handling structure 12, the meniscus 33 may migrate over the surface of the recovery opening 25 in the same direction as the movement of the facing surface. The recovery openings 25 may be formed of a porous member. The immersion liquid may be recovered in single phase. In an embodiment the immersion liquid is recovered in a two phase flow. The two phase flow is received in a chamber 35 within the fluid handling structure 12 where it is separated into liquid and gas. The liquid and gas are recovered through separate channels 36, 38 from the chamber 35.

An inner periphery 39 of the undersurface of fluid handling structure 12 extends into the immersion space 11 away from the inner surface to form a plate 40. The inner periphery 39 forms a small aperture which may be sized to match the shape and size of the radiation beam B. The plate 40 may serve to isolate the immersion liquid at either side of it. The supplied immersion liquid flows inwards towards the aperture, through the inner aperture and then under the plate 40 radially outwardly towards the surrounding the recovery openings 25.

In an embodiment the fluid handling structure 12 is in two parts as shown on the right hand side of FIG. 2b: an inner part 12a and an outer part 12b. The inner part 12a and the outer part 12b may move relatively to each other, in a plane parallel to facing surface. The inner part 12a may have the supply openings 34 and it may have the overflow recovery 24. The outer part 12b may have the plate 40 and the recovery opening 25. The inner part 12a may have an intermediate recovery 42 for recovering the immersion liquid which flows between the inner part 12a and the outer part 12b.

The two different versions of the fluid handling structure of FIG. 2b thus allow for movement of the meniscus 33 in the same direction as the substrate W, enabling faster scan speeds and increased throughput of the lithographic apparatus. However, the migration speed of meniscus 33 over the surface of the recovery opening 25 in the fluid handling structure 12 of the left side of FIG. 2b may be slow. The fluid handling structure 12 of the right side of FIG. 2b allows for quicker movement of the meniscus 33, by moving the outer part 12b with respect to the inner part 12a and the final element 100. However, it may be difficult to control the intermediate recovery 42 so as to ensure that enough immersion liquid is provided between the inner part 12a and the outer part 12b to prevent contact therebetween.

Furthermore, the inventors of the present invention have, for the first time, realized that the intermediate recovery 42, due to being exposed to both the immersion fluid and a surrounding atmosphere, may cause vibrations in the inner part 12a. Such vibrations are also caused by recovering immersion fluid in a two phase flow. These vibrations may affect the meniscus 22 between the final element 100 and the inner part 12a. Movement of the meniscus 22 with respect to the final element 100 may cause undesirable thermal variations on the final element 100. Such thermal variations can lead to distortion of the final element 100 and affect the radiation beam B, resulting in overlay and focus errors. It is thus desirable to provide a fluid handling structure 12 that has a simple construction and reduces or minimized movement of the meniscus 22 with respect to the final element 100.

The present invention will be described below with reference to the fluid handling structure shown in FIGS. 3 and 4. Features shown in these figures which are common to FIGS. 2a and 2b share the same reference numerals.

FIGS. 3a and 3b illustrate, in cross-section, a fluid handling structure 12 according to an embodiment. The fluid handling structure 12 confines immersion fluid to a region of the lithographic apparatus. The fluid handling structure 12 comprises an aperture. The aperture defines the immersion space 11 between the projection system PS and the substrate W. The immersion space 11 is to be filled with the immersion fluid. The aperture is formed in the fluid handling structure 12 for the passage therethrough of the radiation beam B through the immersion fluid. The aperture thus allows the radiation beam B to pass from the projection system PS to the substrate W, for example so as to develop a photoresist provided on the substrate W.

The fluid handling structure 12 comprises an inner part 12a and an outer part 12b. The inner part 12a has an inner surface which complements the conical surface of the frustoconical shape of the final element 100. When the fluid handling structure 12 is provided in the lithographic apparatus, the undersurface of both the inner part 12a and the outer part 12b may be closer to the facing surface of the substrate W than the bottom planar surface of the frustoconical shape. The inner part 12a may entirely surround the final element 100. The inner part 12a is fixed with respect to the final element 100 of the projection system PS of the lithographic apparatus. Movement of the meniscus 22 between the final element 100 and the inner part 12a may thus be prevented or reduced. This reduces thermal variations on the final element 100, which reduces effects on the radiation beam B and overlay and/or focus errors.

The outer part 12b is movable relative to the inner part 12a. When the fluid handling structure 12 is provided in the lithographic apparatus, the outer part 12b is movable relative to the final element 100. The outer part 12b may entirely surround the inner part 12a, as illustrated in FIG. 4. The outer part 12b may move in the same direction as the substrate support WT supporting the substrate W. The outer part 12b may move in a first plane, the first plane being parallel to the facing surface of the substrate W. In FIGS. 3a and 3b, the first plane extends horizontally. When the immersion fluid is confined by the fluid handling structure 12, the meniscus 33 may form between the surface of the substrate W facing the fluid handling structure 12 and the outer part 12b of the fluid handling structure 12. Movement of the outer part 12b in the same direction as the substrate W may thus reduce the relative speed of the meniscus 33 and the substrate W. As explained above, this allows faster scan speeds, and increased throughput of the lithographic apparatus.

The inner part 12a and the outer part 12b form therebetween a variable space 60. When viewed in plan, the variable space 60 may entirely surround the inner part 12a, as illustrated in FIG. 4. When viewed in plan, the outer part 12b may entirely surround the variable space 60. As such, the outer part 12b entirely surrounds the inner part 12a so as to create the variable space 60 between the inner part 12a and the outer part 12b. An inner boundary of the variable space 60 is defined by the inner part 12a, and an outer boundary of the variable space 60 is defined by the outer part 12b. The inner part 12a may be provided between the variable space 60 and the final element 100, such that the variable space 60 is not adjacent to the final element 100. Movement of the immersion fluid in the variable space 60, for example due to movement of the outer part 12b relative to the inner part 12a, thus does not directly cause thermal variations in the final element 100.

The inner part 12a and the outer part 12b also form a connecting space 50 therebetween. The connecting space 50 connects the variable space 60 to the immersion space 11. Fluid communication between the variable space 60, the connecting space 50 and the immersion space 11 is thus enabled, allowing a single fluid supply system to provide the immersion fluid to each of the variable space 60, the connecting space 50 and the immersion space 11. Immersion fluid may be provided in each of the immersion space 11, the connecting space 50 and the variable space 60.

Figure 4A:
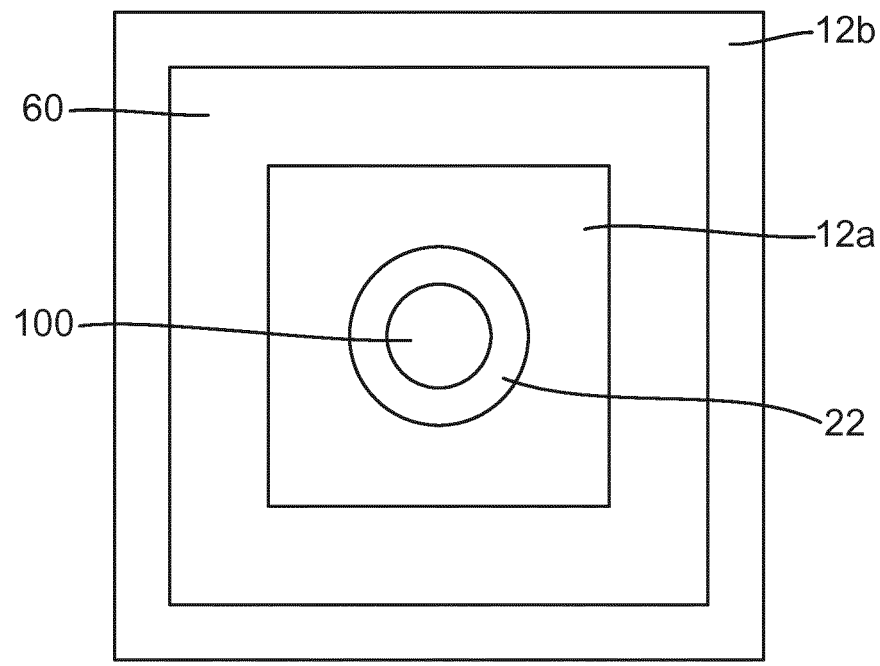
FIGS. 4a and 4b illustrate, in plan, the fluid handling structure of FIGS. 3a and 3b, with the movable outer part in two different positions.
Figure 4B:
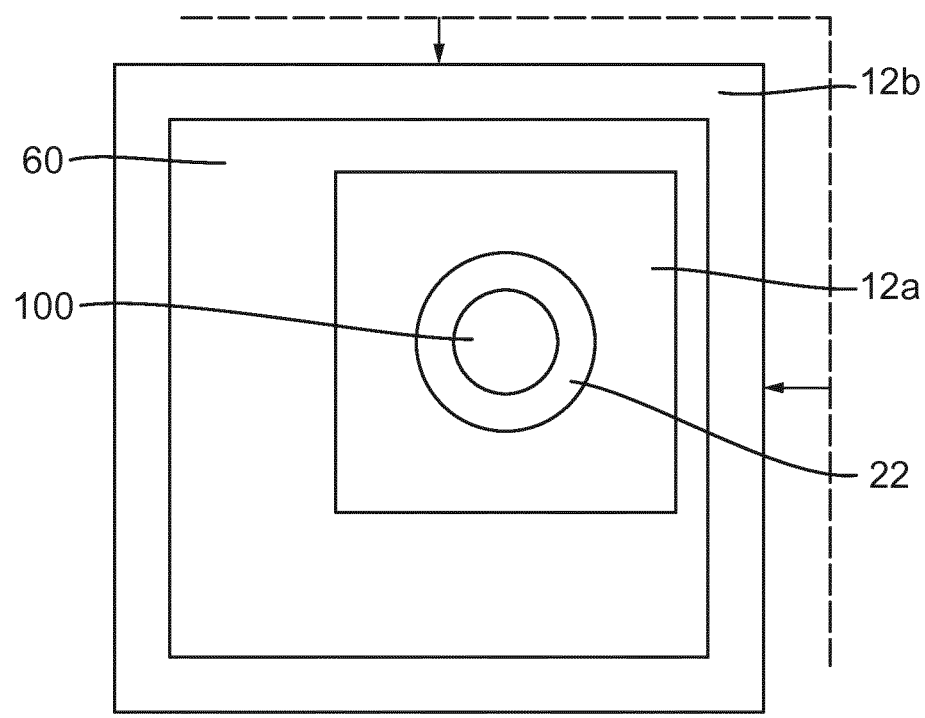

Movement of the outer part 12b relative to the inner part 12a in the first plane changes in shape the variable space 60. Put another way, the variable space 60 is disposed between the inner part 12a and the outer part 12b in the first plane. The extent of the variable space 60 in the first plane sets the range of movement of the outer part 12b relative to the inner part 12a, as best shown in FIGS. 4a and 4b. The variable space 60 may have an annular shape. Movement of the outer part 12b relative to the inner part 12a in the first plane does not change the overall volume of the variable space 60. The average level of the immersion liquid in a second direction that is perpendicular to the first plane is not affected by movement of the outer part 12b relative to the inner part 12a. This is because immersion liquid may flow around the inner part 12a in the variable space 60, as apparent from FIGS. 4a and 4b. In FIGS. 3a and 3b, the second direction corresponds to the vertical direction.

The fluid handling structure 12 is configured to contain the immersion fluid in the variable space 60. The variable space 60 may be fluid-proof so as to contain the immersion fluid. Leaking of the immersion fluid from the variable space 60 into a space other than the connecting space 50 or an overflow recovery 58 may be prevented. As such, a reservoir of immersion fluid is provided in the variable space 60. The upper boundary of the immersion fluid in the variable space 60 may be free standing, and may be overall substantially parallel to the first plane. Immersion fluid may reliably be provided from the variable space 60 to the connecting space 50 and the immersion space 11, even if the outer part 12b is moved relative to the inner part 12a. Compared to the fluid handling structure 12 of the right side of FIG. 2b, the intermediate recovery 42 is not provided in the connecting space 50. Fluid extraction in a two-phase flow may be avoided in the connecting space 50. This reduces vibrations in the inner part 12a. Movement of the meniscus 22 adjacent to the final element 100 is thus minimized or reduced. This reduces variations in thermal effects on the final element 100, reducing effects on the radiation beam B and the risk of overlay and/or focus errors.

Movement of the outer part 12b relative to the inner part 12a in the first plane does not change in shape the connecting space 50. Put another way, the connecting space 50 is disposed between the inner part 12a and the outer part 12b in the second direction. The connecting space 50 may entirely surround the immersion space 11, and be entirely surrounded by the variable space 60. The connecting space 50 may have an annular shape. Movement of the outer part 12b relative to the inner part 12a does not affect the gap between the inner part 12a and the outer part 12b in the second direction, so as not to change the height of the connecting space 50 in the second direction. A constant distance between the inner part 12a and the outer part 12b may thus be maintained in the second direction, preventing contact between the inner part 12a and the outer part 12b. Such contact could lead to the separation of contaminant particles from the fluid handling structure 12 and could lead to vibrations in the inner part 12a, affecting the meniscus 22 adjacent to the final element 100.

The fluid handling structure 12 may further comprise a fluid supply system. The fluid supply system may supply the immersion fluid to the immersion space 11, to the connecting space 50 and to the variable space 60. The fluid supply system may comprise supply openings 34, as already described in relation to FIGS. 2a and 2b. The supply openings 34 may be located in the immersion space 11, so as to provide immersion fluid to the immersion space 11. Immersion fluid may flow from the immersion space 11 to the connecting space 50 and the variable space 60. The liquid supply system may also comprise supply openings (not depicted) located in the variable space 60, so as to provided immersion fluid directly to the variable space 60. This may make the provision of immersion fluid in the variable space 60 easier and more efficient.

The fluid handling structure 12 may, optionally as part of the fluid supply system, comprise an inlet 52 for providing immersion fluid to the connecting space 50. This ensures that immersion fluid can be reliable supplied to the connecting space 50, so as to prevent contact between the inner part 12a and the outer part 12b. The inlet 52 may create a fluid bearing between the inner part 12a and the outer part 12b in the connecting space 50. The immersion fluid in the connecting space 50, optionally supplied by inlet 52, may act as the fluid bearing between the inner part 12a and the outer part 12b. The immersion fluid may entirely fill the connecting space 50. The fluid bearing prevents contact between the inner part 12a and the outer part 12b by providing a buffer of immersion fluid therebetween. The fluid bearing also allows for controlled movement of the outer part 12b relative to the inner part 12a in the first plane.

A so-called "leaky seal" or contactless seal may be provided in the connecting space 50, for example using the inlet 52 and supply openings 34. Immersion fluid is provided to the immersion space 11 by inlet 52 and supply openings 34. The immersion fluid in the immersion space 11 is allowed to leak from the immersion space 11 radially outward. The immersion fluid is allowed to leak from the immersion space 11 into the variable space 60 through the connecting space 50. This prevents the flow of gas bubbles from the variable space 60 to the immersion space 11, without using a physical seal. Gas bubbles in the immersion space 11 could affect the radiation beam B passing through the immersion liquid in the immersion space 11, and are thus undesirable. Use of a physical seal in the connecting space 50 would, due to movement of the outer part 12b relative to the inner part 12a, risk the separation of contaminant particles from the fluid handling structure 12 and may induce vibrations in the inner part 12a.

An overflow recovery 58 may be provided in the variable space 60 of the fluid handling structure 12. The overflow recovery 58 may be similar to the overflow recovery 24 already discussed in relation to FIGS. 2a and 2b. The fluid handling structure 12 may optionally also include the overflow recovery 24. The overflow recovery 58 may extract immersion fluid above a pre-set level from the variable space 60. The overflow recovery 58 may be provided in the inner part 12a, as shown in FIGS. 3a and 3b. Alternatively, the overflow recovery 58 may be provided in the outer part 12b. The overflow recovery 58 ensures that immersion fluid does not spill over the fluid handling structure 12 in the variable space 60. The overflow recovery 58 may also be used to maintain a constant level of immersion liquid in the variable space 60. This may reduce a pressure variation of immersion liquid confined by the fluid handling structure 12, resulting in a more stable operation of the fluid handling structure 12. The overflow recovery 58 may be arranged above the supply openings 34 and inlet 52 to facilitate the overflow recovery 58 effectively removing immersion fluid. The overflow recovery 58 may be arranged such that immersion fluid only flows into the overflow recovery 58 when immersion fluid flows over the top of the inner part 12a or over the top of the outer part 12b of the fluid handling structure 12. The overflow recovery 58 may be arranged at the top of the inner part 12a or outer part 12b. More information on overflow recovery is given in US 2005/0263068 A1, which is incorporated herein by reference.

The fluid handling structure 12, for example the inner part 12a, may further comprise a fluid extractor 56 for extracting immersion fluid from the connecting space 50. The fluid extractor 56 may comprise an opening to the connecting space 50. The fluid extractor 56 may act as means of suspension of the outer part 12b, so as to suspend the outer part 12b from the inner part 12a by extracting immersion liquid. The location of the outer part 12b in the second direction may be maintained or controlled by controlled extraction of immersion fluid from the connecting space 50 by means of the fluid extractor 56. This ensures that the position of the outer part 12b is stable. The fluid extractor 56 may further be used in the contactless seal, created by immersion fluid supplied by the supply openings 34 and inlet 52 as discussed above. The fluid extractor 56 may be used to ensure that gas bubbles do not travel from the variable space 60 through the connecting space 50 into the immersion space 11. The fluid extractor 56 may comprise an outlet positioned radially inward (or closer to the immersion space 11) of the inlet 52 and/or an outlet positioned radially outward (or further away from the immersion space 11) of the inlet 52. Providing both of these outlets allows better control of the location of the outer part 12b in the second direction and improved suspension of the outer part 12b from the inner part 12a.

The fluid extractor 56 may be a single phase fluid extractor, for extracting the immersion fluid in a single phase flow. In this case the fluid extractor 56 may extract immersion liquid, but not extract a gas, from the connecting space 50. Compared to the intermediate recovery 42 of the fluid handling structure 12 on the right side of FIG. 2b, the fluid extractor 56 is, in use, only exposed to the immersion liquid and not to the surrounding atmosphere. The fluid extractor 56 thus gives rise to negligible or at least reduced vibrations in the inner part 12a. Movement of the meniscus 22 between the inner part 12a and the final element 100 is thus reduced, reducing thermal effects thereof on the final element 100 and reducing overlay and/or focus errors.

The fluid handling structure 12 may move, by extracting the immersion fluid from the connecting space 50 with the fluid extractor 56, at least part of the outer part 12b in the second direction perpendicular to the first plane. Such movement of the at least part of the outer part 12b may change the shape of the connecting space 50 in the second direction. Controlling the fluid extractor 56 may thus control the height of the connecting space 50 in the second direction. This allows for control of the passage of immersion fluid from the variable space 60 through the connecting space 50 to the immersion space 11. Furthermore, moving the outer part 12b closer or further away from the final element 100 in the second direction may affect the position of the meniscus 22 between the final element 100 and the inner part 12a. Controlling extraction of the fluid extractor 56 thus allows for control of the position or movement of the meniscus 22. The meniscus 22 can thus actively be kept stable and movement thereof reduced. This may reduce thermal variations on the final element 100 and further reduce overlay and/or focus errors.

The outer part 12b may comprise a meniscus pinning device 72 for pinning the meniscus 33. The meniscus 33 extends between the outer part 12b and the surface of the substrate W facing the outer part 12b. The meniscus pinning device 72 may make it energetically favourable for the meniscus 33 to remain adhered to the outer part 12b when the substrate W moves relative to the outer part 12b. The meniscus pinning device 72 ensures that the meniscus 33 is pinned to the outer part 12b, such that the meniscus 33 moves with the outer part 12b when the outer part 12b moves relative to the inner part 12a in the first plane. The meniscus 33 can thus be moved in the same direction as the substrate W, reducing the relative speed between the meniscus 33 and the substrate W. The meniscus pinning device 72 also improves the stability of meniscus 33, such that the critical relative speed above which the meniscus 33 between the fluid handling structure 12 and the substrate W becomes unstable is increased. The speed of the substrate W can thus be further increased, increasing the throughput of the lithographic apparatus.

The meniscus pinning device 72 may actively pin the meniscus 33. For example, the meniscus pinning device 72 may comprise an array of small holes for extracting immersion fluid, any other suitable immersion fluid extractor and/or a gas knife. Further alternatively, the meniscus pinning device 72 may passively pin the meniscus 33, for example due to its geometry. For example, the meniscus pinning device 72 may be in the form of a projection which projects radially towards the substrate W from the outer part 12b, a sharp edge at a position radially outward (or facing away) from the immersion space 11, a tapered lower surface of the outer part 12b facing the substrate W, or a step change in distance between the outer part 12b and the substrate W. More information on meniscus pinning devices is given in US 2007/0110213 A1, which is incorporated herein by reference.

The outer part 12b may comprise a plate 14 and a barrier member 16. The plate 14 may be connected to the barrier member 16, and extend from the barrier member 16 towards the immersion space 11. The plate 14 may extend in the first plane. The plate 14 may define a lower boundary (or a boundary away from the inner part 12a) of the connecting space 50. The inner part 12a may define at upper boundary of the connecting space 50. The plate 14 may be thin, so that only little immersion fluid is displaced when the plate 14 is moved towards the immersion space 11 during movement of the outer part 12b in the first plane. For example, the plate 14 may have a thickness of less than 1 mm, or of less than 30% of the distance between the final element 100 and the surface of the substrate W. This ensures that the effect on the meniscus 22 of moving the plate 14 towards and away from the immersion space 11 is low or negligible. The barrier member 16 is located at the end of the plate 14 radially outward of (or away from) from the final element 100. The barrier member 16 may define an outer boundary of the variable space 60. The inner part 12a may define an inner boundary of the variable space 60. The plate 14 may define a lower boundary of the connecting space 50. The barrier member 16 may comprise the meniscus pinning device 72. The barrier member 16 may also comprise the overflow recovery 58.

The fluid handling structure 12 of FIGS. 3a and 3b may be used in the lithographic apparatus. The projection system PS of the lithographic apparatus comprises the final element 100. The inner part 12a of the fluid handling structure 12 is fixed with respect to the final element 100. The substrate support WT of the lithographic apparatus supports the substrate W. The substrate support WT is movable with respect to the final element 100 in the first plane. FIGS. 3a and 3*b* show the fluid handling structure 12 arranged in the lithographic apparatus with the final element 100 and with the substrate W supported by the substrate support WT. FIG. 3*b* shows the outer part 12*b* in a different position than in FIG. 3*a*. Compared to FIG. 3*a*, the outer part 12*b* of the fluid handling structure 12 is moved to the left in FIG. 3*b*.

As shown in FIGS. 3*a* and 3*b*, in use, the meniscus 33 extends between the substrate W supported by the substrate support WT and the outer part 12*b* of the fluid handling structure 12. The meniscus pinning device 72 of the outer part 12*b* of the fluid handling structure 12 pins the meniscus 33 to the outer part 12*b*. As such, meniscus 33 moves with the outer part 12*b*. By moving the outer part 12*b* simultaneously in the same direction as the substrate W, the relative speed between meniscus 33 and the substrate W may be decreased. Movement of the outer part 12*b* relative to the inner part 12*a* may be achieved actively or passively. When movement is active, the lithographic apparatus may comprise a controller 500 for controlling movement of the outer part 12*b* relative to the inner part 12*a* during movement of the substrate support WT relative to the projection system PS. The controller 500 may control movement of the outer part 12*b* such that the relative speed between the outer part 12*b* (and therefore the meniscus 33 pinned by the outer part 12*b*) and the substrate W is lower than would be the case with no movement of the outer part 12*b* relative to the inner part 12*a*. The controller 500 may move the outer part 12*b* at a speed equal to two times the speed of the substrate W or less, so as to reduce the relative speed between the outer part 12*b* and the substrate W. Preferably, the controller 500 moves the outer part 12*b* at a speed less than the speed of the substrate W. The outer part 12*b* may be actuated by an actuator 510, for example a piezo electric actuator, a linear motor, etc. When movement is passive, the outer part 12*b* may be attached, for example, to a point fixed with respect to the projection system PS by one or more springs or elastic elements. Friction through the immersion liquid between the outer part 12*b* and the substrate W may provide a force for the outer part 12*b* to be moved in the same direction as the substrate W.

In use, the meniscus 22 extends between the final element 100 of the projection system PS and the inner part 12*a* of the fluid handling structure 12. The shape (or position or movement) of the meniscus 22 may be controlled by moving at least part of the outer part 12*b* in the second direction that is perpendicular to the first plane or the surface of the substrate W. The at least part of the outer part 12*b* may be moved by extracting immersion fluid from the connecting space 50, as explained above. The at least part of the outer part 12*b* may be the plate 14, or part of the plate 14 of the outer part 12*b*. The lithographic apparatus may comprise the controller 500 for controlling extraction of the fluid extractor 56 of the fluid handling structure 12. Such control may move the at least part of the outer part 12*b* of the fluid handling structure 12 at the same time as moving the outer part 12*b* of the fluid handling structure 12 relative to the inner part 12*a* in the first plane. The controller 500 may ensure that movement of the meniscus 22 is less than would be the case with no control. For example, with reference to FIGS. 3*a* and 3*b*, moving the outer part 12*b* to the left moves the right part of the outer part 12*b* towards the immersion space 11, and moves the left part of the outer part 12*b* away from the immersion space 11. This could temporarily raise the meniscus 22 on the right side of the final element 100, and temporarily lower the meniscus 22 on the left side of the final element 100. To counteract this, the controller 500 may control the fluid extractor 56 so as to move the right side of the outer part 12*b* away from the final element 100 in the second direction (i.e. in a down direction), and so as to move the left side of the outer part 12*b* towards the final element 100 in the second direction (i.e. in an up direction). Movement of the meniscus 22 due to movement of the outer part 12*b* in the first plane may thus actively be reduced or prevented.

FIGS. 4*a* and 4*b* show the fluid handling structure 12 of FIGS. 3*a* and 3*b* in plan. The fluid handling structure 12 is arranged around the final element 100 of the projection system PS. FIG. 4*b* shows the fluid handling structure 12 of FIG. 4*a*, with the outer part 12*b* in a different location. As apparent from FIG. 4*b*, the variable space 60 does not change in volume, but changes in shape, when the outer part 12*b* moves relative to the inner part 12*a*. Movement of the outer part 12*b* relative to the inner part 12*a* may be active or passive. The outer part 12*b* is shown in FIGS. 4*a* and 4*b* as being rectangular, but the outer part 12*b* may also be circular or have any other geometries surrounding the inner part 12*a*. Similarly, the geometries of the inner part 12*a* and the final element 100 are not limited to those depicted in FIGS. 4*a* and 4*b*.

Use of the fluid handling structure 12 and use of the lithographic apparatus comprising the fluid handling structure 12 may include providing the immersion fluid in the immersion space 11, the connecting space 50 and the variable space 60. The immersion fluid may be provided by the liquid supply system. Further, the outer part 12*b* may be moved relative to the inner part 12*a* in the first plane. The substrate support WT and the outer part 12*b* of the fluid handling structure may be moved simultaneously in the same direction.

Embodiments are provided according to the following clauses:

1. A fluid handling structure configured to confine immersion fluid to a region of a lithographic apparatus, the fluid handling structure comprising:

an aperture formed therein for the passage therethrough of a radiation beam through the immersion fluid, the aperture defining an immersion space to be filled with the immersion fluid, and an inner part and an outer part, wherein the inner part and the outer part are arranged so as to form therebetween a variable space and a connecting space that connects the variable space to the immersion space, wherein the outer part is movable relative to the inner part in a first plane so as to change in shape the variable space but not the connecting space, and wherein the fluid handling structure is configured to contain the immersion fluid in the variable space.

2. The fluid handling structure of clause 1, further comprising a fluid supply system configured to supply immersion fluid to the immersion space, to the connecting space and to the variable space.

3. The fluid handling structure of clause 1 or clause 2, further comprising an overflow recovery for extracting immersion fluid above a pre-set level from the variable space.

4. The fluid handling structure of any of clauses 1 to 3, configured such that, when viewed in plan, the outer part entirely surrounds the inner part so as to create the variable space between the inner part and the outer part and/or movement of the outer part relative to the inner part in the first plane does not change the overall volume of the variable space.

5. The fluid handling structure of any of clauses 1 to 4, wherein the outer part comprises a meniscus pinning device for pinning an immersion fluid meniscus.

6. The fluid handling structure of any of clauses 1 to 5, further comprising an inlet for providing the immersion fluid to the connecting space and/or a fluid extractor for extracting the immersion fluid from the connecting space.

7. The fluid handling structure of clause 6, wherein the inlet is configured to create a fluid bearing between the inner part and the outer part in the connecting space and/or the fluid extractor comprises a single phase fluid extractor.

8. The fluid handling structure of clause 6 or clause 7, wherein the fluid handling structure is configured to move, by extracting the immersion fluid from the connecting space with the fluid extractor, at least part of the outer part in a second direction perpendicular to the first plane so as to change the shape of the connecting space in the second direction.

9. The fluid handling structure of any of clauses 1 to 8, wherein the immersion fluid is provided in the immersion space, in the connecting space and in the variable space.

10. The fluid handling structure of clause 9, wherein the immersion fluid in the connecting space acts as a fluid bearing between the inner part and the outer part.

11. A lithographic apparatus comprising:
    the fluid handling structure of any of clauses 1 to 10;
    a projection system comprising a final element, the inner part of the fluid handling structure being fixed with respect to the final element; and
    a substrate support configured to support a substrate, the substrate support being movable with respect to the final element in the first plane.

12. The lithographic apparatus of clause 11, wherein, in use, a first meniscus of the immersion fluid extends between the substrate supported by the substrate support and the outer part of the fluid handling structure, wherein a meniscus pinning device of the outer part of the fluid handling structure is configured to pin the first meniscus, and/or a second meniscus of the immersion fluid extends between the final element of the projection system and the inner part of the fluid handling structure, wherein the fluid handling structure is configured to control the shape of the second meniscus by moving at least part of the outer part in a second direction that is perpendicular to the first plane.

13. The lithographic apparatus of clause 11 or clause 12, further comprising a controller for controlling movement of the outer part relative to the inner part during movement of the substrate support relative to the projection system such that a relative speed between the outer part and the substrate is lower than would be the case with no movement of the outer part relative to the inner part, and/or a controller for controlling extraction of a fluid extractor of the fluid handling structure, so as to move at least part of the outer part of the fluid handling structure, when moving the outer part of the fluid handling structure relative to the inner part in the first plane, such that movement of the second meniscus is less than would be the case with no such control.

14. A method of using the fluid handling structure of any of clauses 1 to 10 or the lithographic apparatus of any of clauses 11 to 13, the method comprising providing the immersion fluid in the immersion space, the connecting space and the variable space.

15. The method of clause 14, further comprising moving the outer part relative to the inner part or moving the substrate support and the outer part of the fluid handling structure simultaneously in the same direction.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A fluid handling structure configured to confine immersion fluid to a region of a lithographic apparatus, the fluid handling structure comprising:
    an aperture formed therein for the passage therethrough of a radiation beam through the immersion fluid, the aperture defining an immersion space to be filled with the immersion fluid, and
    an inner part and an outer part,
    wherein the inner part and the outer part are arranged to form therebetween a variable space and a connecting space that connects the variable space to the immersion space, wherein the outer part is movable relative to the inner part in a first plane to change in shape in the first plane the variable space but not the connecting space, and wherein the fluid handling structure is configured to contain the immersion fluid in the variable space.

2. The fluid handling structure of claim 1, further comprising a fluid supply system configured to supply immersion fluid to the immersion space, to the connecting space and to the variable space.

3. The fluid handling structure of claim 1, further comprising an overflow recovery configured to extract immersion fluid above a pre-set level from the variable space.

4. The fluid handling structure of claim 1, configured such that, when viewed in plan, the outer part entirely surrounds the inner part so as to create the variable space between the inner part and the outer part and/or such that movement of the outer part relative to the inner part in the first plane does not change the overall volume of the variable space.

5. The fluid handling structure of claim 1, wherein the outer part comprises a meniscus pinning device configured to pin an immersion fluid meniscus.

6. The fluid handling structure of claim 1, further comprising an inlet configured to provide immersion fluid to the connecting space and/or a fluid extractor configured to extract immersion fluid from the connecting space.

7. The fluid handling structure of claim 6, wherein the fluid handling structure comprises the inlet and the inlet is configured to create a fluid bearing between the inner part and the outer part in the connecting space and/or wherein the fluid handling structure comprises the fluid extractor and the fluid extractor comprises a single phase fluid extractor.

8. The fluid handling structure of claim 6, wherein the fluid handling structure comprises the fluid extractor and wherein the fluid handling structure is configured to move, by extracting immersion fluid from the connecting space with the fluid extractor, at least part of the outer part in a direction essentially perpendicular to the first plane so as to change the shape of the connecting space in the direction.

9. The fluid handling structure of claim 1, configured such that the immersion fluid is provided in the immersion space, in the connecting space and in the variable space.

10. The fluid handling structure of claim 9, configured such that the immersion fluid in the connecting space acts as a fluid bearing between the inner part and the outer part.

11. A lithographic apparatus comprising:
the fluid handling structure of claim 1;
a projection system comprising a final element, the inner part of the fluid handling structure being essentially fixed at least in a direction in the first plane with respect to the final element; and
a substrate support configured to support a substrate, the substrate support being movable with respect to the final element in the first plane.

12. The lithographic apparatus of claim 11, wherein, in use, a first meniscus of the immersion fluid extends between the substrate supported by the substrate support and the outer part of the fluid handling structure, wherein a meniscus pinning device of the outer part of the fluid handling structure is configured to pin the first meniscus, and/or
wherein, in use, a second meniscus of the immersion fluid extends between the final element of the projection system and the inner part of the fluid handling structure, wherein the fluid handling structure is configured to control the shape of the second meniscus by moving at least part of the outer part in a direction that is essentially perpendicular to the first plane.

13. The lithographic apparatus of claim 11, further comprising a controller configured to control movement of the outer part relative to the inner part during movement of the substrate support relative to the projection system such that a relative speed between the outer part and the substrate is lower than would be the case with no movement of the outer part relative to the inner part, and/or
a controller configured to control extraction of a fluid extractor of the fluid handling structure, so as to move at least part of the outer part of the fluid handling structure, when moving the outer part of the fluid handling structure relative to the inner part in the first plane, such that movement of a meniscus of the immersion fluid that extends, in use, between the final element of the projection system and the inner part of the fluid handling structure is less than would be the case with no such control.

14. A method of using the fluid handling structure of claim 1, the method comprising providing the immersion fluid in the immersion space, the connecting space and the variable space.

15. The method of claim 14, further comprising moving the outer part relative to the inner part or moving a substrate support used to at least part confine fluid in the immersion space and the outer part of the fluid handling structure simultaneously in a same direction.

16. A fluid handling structure configured to confine immersion fluid to a region of a lithographic apparatus, the fluid handling structure comprising:
an inner part configured to contain an immersion fluid in an immersion space for the passage therethrough of a radiation beam, the inner part having an outer boundary; and
a movable outer part arranged to be outward, relative to a central portion of the inner part, of the outer boundary, the outer part arranged to form a variable space to contain immersion fluid between the inner part and the outer part and to form a connecting space that connects the variable space to the immersion space,
wherein the outer part is movable relative to the inner part in a first plane to change in shape in the first plane the variable space but keep the connecting space substantially the same.

17. The fluid handling structure of claim 16, configured such that, when viewed in plan, the outer part entirely surrounds the inner part so as to create the variable space between the inner part and the outer part and/or such that movement of the outer part relative to the inner part in the first plane does not change the overall volume of the variable space.

18. The fluid handling structure of claim 16, wherein the outer part comprises a meniscus pinning device configured to pin an immersion fluid meniscus.

19. The fluid handling structure of claim 16, configured to move, by extraction of immersion fluid from the connecting space, at least part of the outer part in a direction essentially perpendicular to the first plane so as to change the shape of the connecting space in the direction.

20. A fluid handling structure configured to confine immersion fluid to a region of a lithographic apparatus, the fluid handling structure comprising:
an inner part configured to contain an immersion fluid in an immersion space for the passage therethrough of a radiation beam, the inner part having an outer wall extending in the vertical to contain immersion fluid; and a movable outer part having an inner wall that extends in the vertical and that is configured to be located inward, relative to a central portion of the fluid handling structure, of the outer wall, the outer wall arranged to form a variable space to contain immersion fluid between the outer wall of the inner part and the inner wall of the outer part and to form a connecting space that connects the variable space to the immersion space, wherein the outer part is movable relative to the inner part in a first plane to change in shape the variable space.

* * * * *